(12) United States Patent
Bae

(10) Patent No.: US 10,473,848 B2
(45) Date of Patent: Nov. 12, 2019

(54) DISPLAY PANEL AND DISPLAY APPARATUS INCLUDING THE SAME

(71) Applicant: SAMSUNG DISPLAY CO., LTD., Yongin-si, Gyeonggi-Do (KR)

(72) Inventor: Hyunchul Bae, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 77 days.

(21) Appl. No.: 15/479,432

(22) Filed: Apr. 5, 2017

(65) Prior Publication Data

US 2017/0293176 A1    Oct. 12, 2017

(30) Foreign Application Priority Data

Apr. 6, 2016  (KR) .................. 10-2016-0042484

(51) Int. Cl.
| | | |
|---|---|---|
| *F21V 7/04* | (2006.01) | |
| *F21V 8/00* | (2006.01) | |
| *H01L 23/498* | (2006.01) | |
| *G02F 1/1335* | (2006.01) | |
| *G02B 6/00* | (2006.01) | |
| *G02F 1/1333* | (2006.01) | |

(52) U.S. Cl.
CPC ............. *G02B 6/0088* (2013.01); *G02B 6/00* (2013.01); *G02F 1/133512* (2013.01); *H01L 23/4985* (2013.01); *G02F 2001/133388* (2013.01)

(58) Field of Classification Search
CPC .... G02B 6/00; G02B 6/0088; G02F 1/133512

USPC ..................................... 349/56, 58; 362/611
See application file for complete search history.

(56) References Cited

U.S. PATENT DOCUMENTS

| | | | |
|---|---|---|---|
| 2004/0150981 A1* | 8/2004 | Katsuda ............... | G02B 6/0088 362/620 |
| 2010/0123850 A1* | 5/2010 | Miyashita ......... | G02F 1/133308 349/58 |
| 2012/0063167 A1* | 3/2012 | Ozawa ................ | G02B 6/0031 362/609 |
| 2012/0127091 A1* | 5/2012 | Kim .................... | G02F 1/13338 345/173 |

(Continued)

FOREIGN PATENT DOCUMENTS

| | | |
|---|---|---|
| KR | 10-1347566 | 12/2013 |
| KR | 10-1436806 | 8/2014 |
| KR | 1020150052926 | 5/2015 |

(Continued)

*Primary Examiner* — Matthew J. Peerce
(74) *Attorney, Agent, or Firm* — F. Chau & Associates, LLC

(57) ABSTRACT

Provided is a display apparatus including a display panel including a display area, a first non-display area surrounding the display area, and a second non-display area surrounding the first non-display area. The display panel includes an upper substrate overlapping the display area, the first non-display area, and the second non-display area. The display panel includes a lower substrate positioned below the upper substrate and overlapping the display area and the first non-display area. The display panel includes a light shielding member positioned below the upper substrate and overlapping the second non-display area. An inner surface of the light shielding member faces a side surface of the lower substrate.

21 Claims, 7 Drawing Sheets

(56) References Cited

U.S. PATENT DOCUMENTS

2014/0041302 A1    2/2014  Heirtzler et al.
2015/0055026 A1*  2/2015  Ikuta ........................ H04N 5/64
                                                  348/791

FOREIGN PATENT DOCUMENTS

| KR | 1020150063783 | 6/2015 |
| KR | 1020150072534 | 6/2015 |
| KR | 10-1594611 | 2/2016 |

* cited by examiner

DISPLAY PANEL AND DISPLAY APPARATUS INCLUDING THE SAME

CROSS-REFERENCE TO RELATED APPLICATION

This U.S. non-provisional patent application claims priority under 35 U.S.C. § 119 to Korean Patent Application No. 10-2016-0042484, filed on Apr. 6, 2016, the disclosure of which is incorporated by reference herein in its entirety.

TECHNICAL FIELD

Exemplary embodiments of the present invention relate to a display panel, and more particularly to a display apparatus including the same.

DISCUSSION OF RELATED ART

A display apparatus may include a liquid crystal display device (LCD), a plasma display device (PDP), a field emission display device (FED), a light emitting diode display device, or an organic light emitting diode display device.

SUMMARY

An exemplary embodiment of the present invention provides a display panel having increased display quality and a display apparatus including the same.

The display panel and the display apparatus according to exemplary embodiments of the present invention may each be relatively thin.

An exemplary embodiment of the present invention provides a display apparatus including a display panel and a backlight unit disposed below the display panel.

In an exemplary embodiment of the present invention, a display panel includes a display area, a first non-display area surrounding the display area, and a second non-display area surrounding the first non-display area. The display panel includes an upper substrate overlapping the display area, the first non-display area, and the second non-display area. The display panel includes a lower substrate positioned below the upper substrate and overlapping the display area and the first non-display area. The display panel includes a light shielding member positioned below the upper substrate and overlapping the second non-display area. An inner surface of the light shielding member faces a side surface of the lower substrate.

In an exemplary embodiment of the present invention, the upper substrate may have a surface area greater than that of the lower substrate when viewed in a plan view. The lower substrate may expose a portion of the upper substrate in the second non-display area.

In an exemplary embodiment of the present invention, the light shielding member may be disposed below the upper substrate to overlap the second non-display area and face a side surface of the lower substrate.

In an exemplary embodiment of the present invention, the light shielding member may include one of a rubber material, a sponge material, or a resin material. In an exemplary embodiment of the present invention, the light shielding member may have a thickness greater than that of the lower substrate In an exemplary embodiment of the present invention, the upper substrate may include signal lines overlapping the display area, the first non-display area, and the second non-display area. The display apparatus may include a flexible circuit film connected to the signal lines, a driving chip mounted on the flexible circuit film, and a printed circuit board connected to the flexible circuit film.

In an exemplary embodiment of the present invention, the flexible circuit film may be disposed between a portion of the light shielding member and a portion of the upper substrate.

In an exemplary embodiment of the present invention, the backlight unit may include a bottom chassis including a bottom part disposed below the lower substrate and a sidewall part bent to extend from the bottom part. The backlight unit may include a mold frame including a first frame disposed on the bottom part and the sidewall part and below the light shielding member and the lower substrate and a second frame bent to extend from the first frame and to face the sidewall part. The backlight unit may include a light guide plate disposed between the bottom chassis and the mold frame. The backlight unit may include an optical unit positioned in the bottom chassis. The optical unit may be configured to provide light to the light guide plate. The flexible circuit film may be bent to face the light shielding member, the second frame, and the bottom part.

In an exemplary embodiment of the present invention, the light shielding member may be fixed to the first frame.

In an exemplary embodiment of the present invention, the bottom part of the bottom chassis may include at least one recessed portion configured to support the light source unit.

In an exemplary embodiment of the present invention, the backlight unit may further include a first protective part facing the second frame. The flexible circuit film may be positioned between the first protective part and the second frame. A second protective part may be bent to extend from the first protective part and disposed below the bottom part. A third protective part may be bent to extend from the second protective part to face the first protective part.

In an exemplary embodiment of the present invention, the printed circuit board may be disposed between the bottom chassis and the second protective part.

In an exemplary embodiment of the present invention, the upper substrate may include first and second side surfaces extending in a first direction and spaced apart from each other in a second direction crossing the first direction and third and fourth side surfaces extending in the second direction and spaced apart from each other in the first direction. The first side surface may be substantially covered by the first protective part.

In an exemplary embodiment of the present invention, the display apparatus may include comprising a coupling member configured to couple the upper substrate, the light shielding member, and the second frame with each other. The coupling member may substantially cover at least one of the second, third and fourth side surfaces of the upper substrate, one side surface of the light shielding member, and one side surface of the second frame. The at least one of the second, third and fourth side surfaces of the upper substrate, the one side surface of the light shielding member, and the one side surface of the second frame may be substantially aligned with each other along a direction perpendicular to a top surface of the upper substrate.

In an exemplary embodiment of the present invention, the mold frame may include a third frame extending from the second frame and facing one side surface of the second side surface, the third side surface, and the fourth side surface and one side surface of the light shielding member.

In an exemplary embodiment of the present invention, a sealing member disposed between the one side surface of the second side surface, the third side surface, and the fourth side surface and the third frame and between the third frame and the one side surface of the light shielding member.

In an exemplary embodiment of the present invention, the lower substrate may include signal lines overlapping the display area and the first non-display area. The display apparatus may include a flexible circuit film connected to the signal lines, a driving chip mounted on the flexible circuit film, and a printed circuit board connected to the flexible circuit film.

In an exemplary embodiment of the present invention, the flexible circuit film may be disposed between the upper substrate and the lower substrate and between the upper substrate and the light shielding member.

In an exemplary embodiment of the present invention, a display panel includes an upper substrate including a display area, a first non-display area substantially surrounding the display area, a second non-display area substantially surrounding the display area with the first non-display area therebetween. An image is provided through a top surface of the upper substrate. A lower substrate is disposed below the upper substrate and overlapping the display area and the first non-display area. A light shielding member is disposed below the upper substrate and overlaps the second non-display area and faces a side surface of the lower substrate. When viewed in a plan view, the upper substrate has a surface area greater than that of the lower substrate, and the lower substrate exposes the second non-display area of the upper substrate.

In an exemplary embodiment of the present invention, the light shielding member substantially surrounds side surfaces of the lower substrate.

BRIEF DESCRIPTION OF THE FIGURES

The above and other features of the present invention will become more apparent by describing in detail exemplary embodiments thereof with reference to the accompanying drawings, in which.

DETAILED DESCRIPTION

Figure 1:
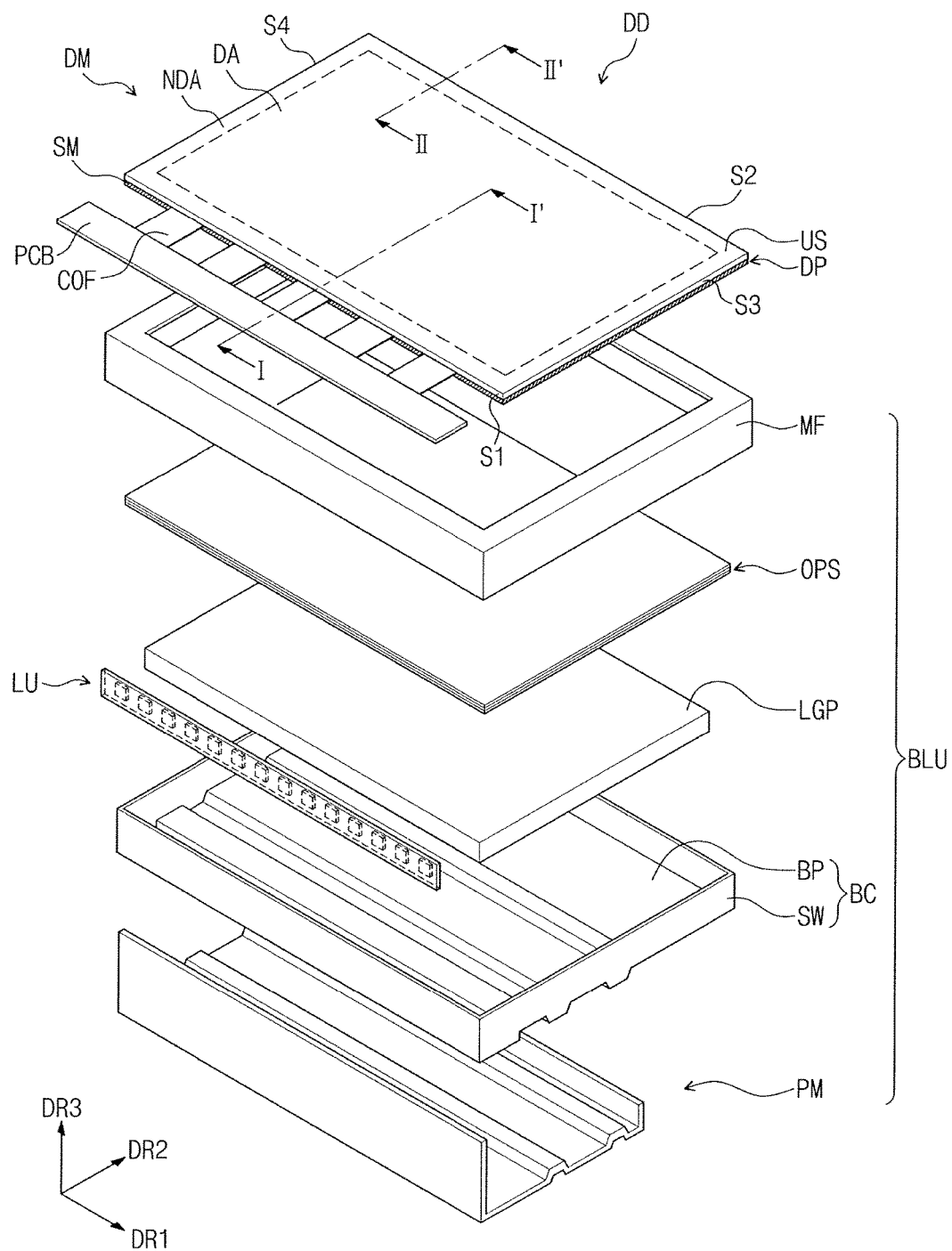
FIG. 1 is an exploded perspective view of a display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

It will be understood that when a component, such as a layer, a film, a region, or a plate, is referred to as being "on" another component, the component may be directly on the other component or intervening components may be present.

Like reference numerals may refer to like elements throughout the specification and drawings. It will be understood that although the terms "first" and "second" may be used herein to describe various components, these components should not be limited by these terms.

Figure 2:
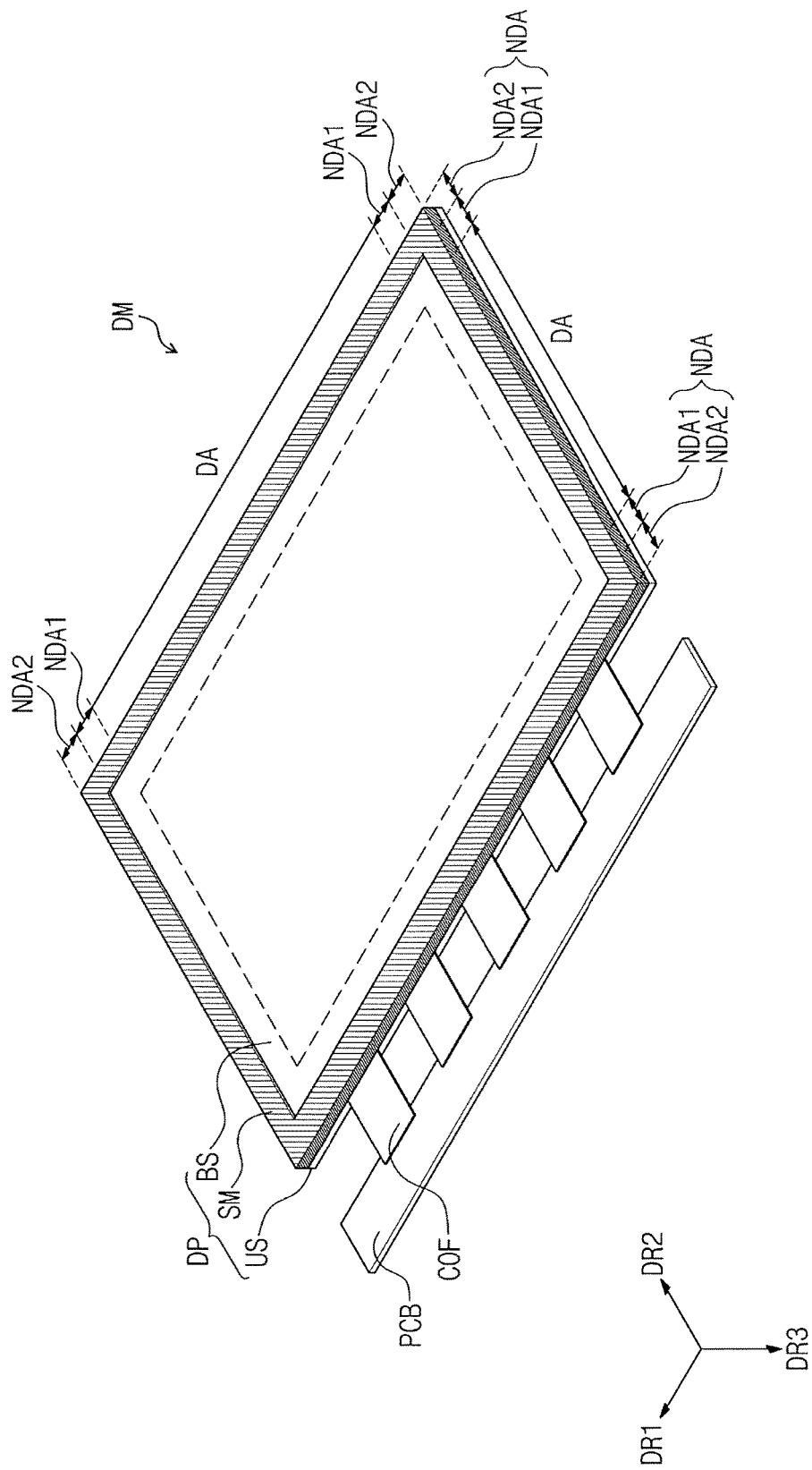
FIG. 2 is a perspective view of a display module according to an exemplary embodiment of the present invention.
Figure 3:
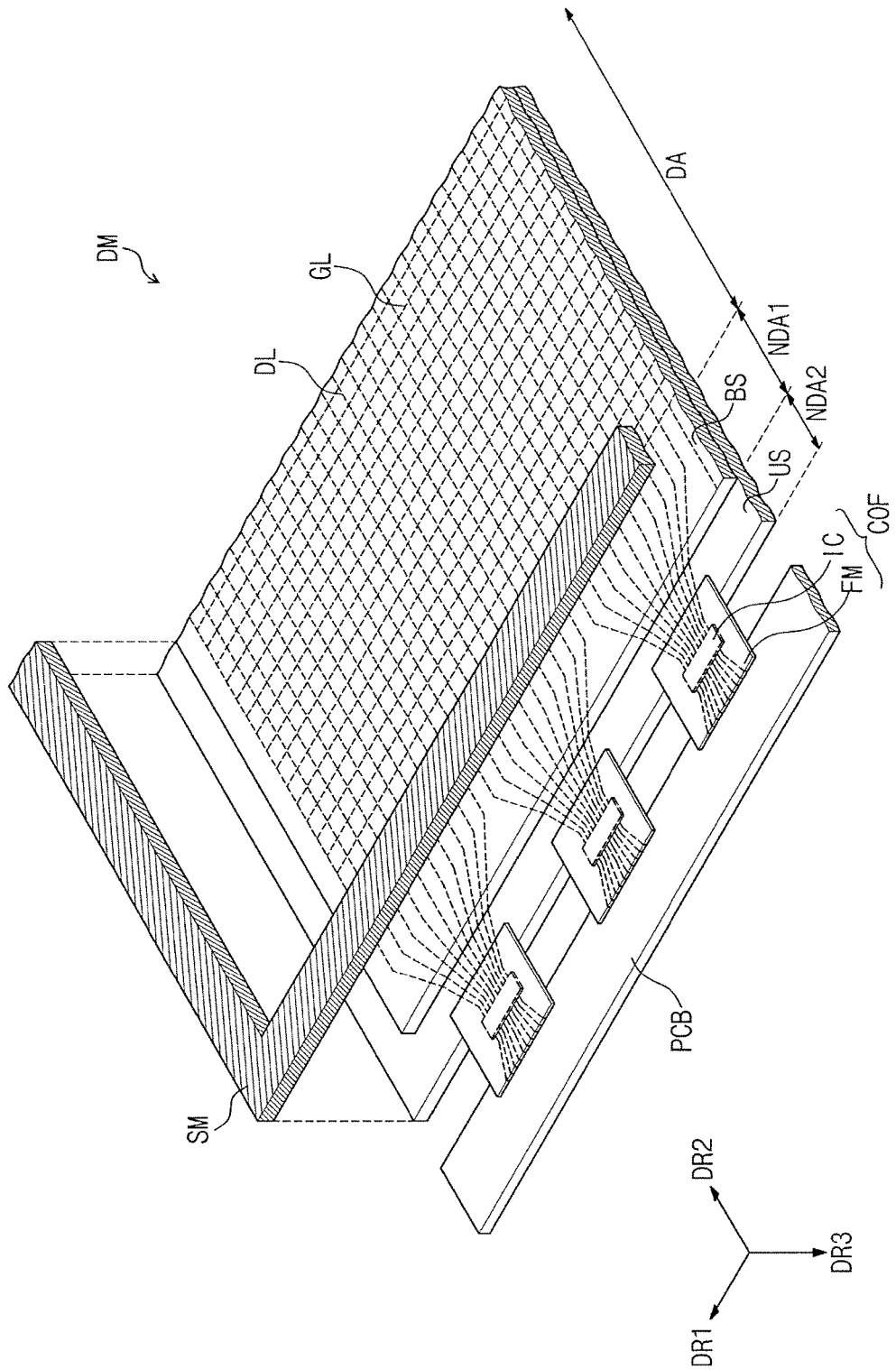
FIG. 3 is a partial exploded perspective view of a display module according to an exemplary embodiment of the present invention.
Figure 4:
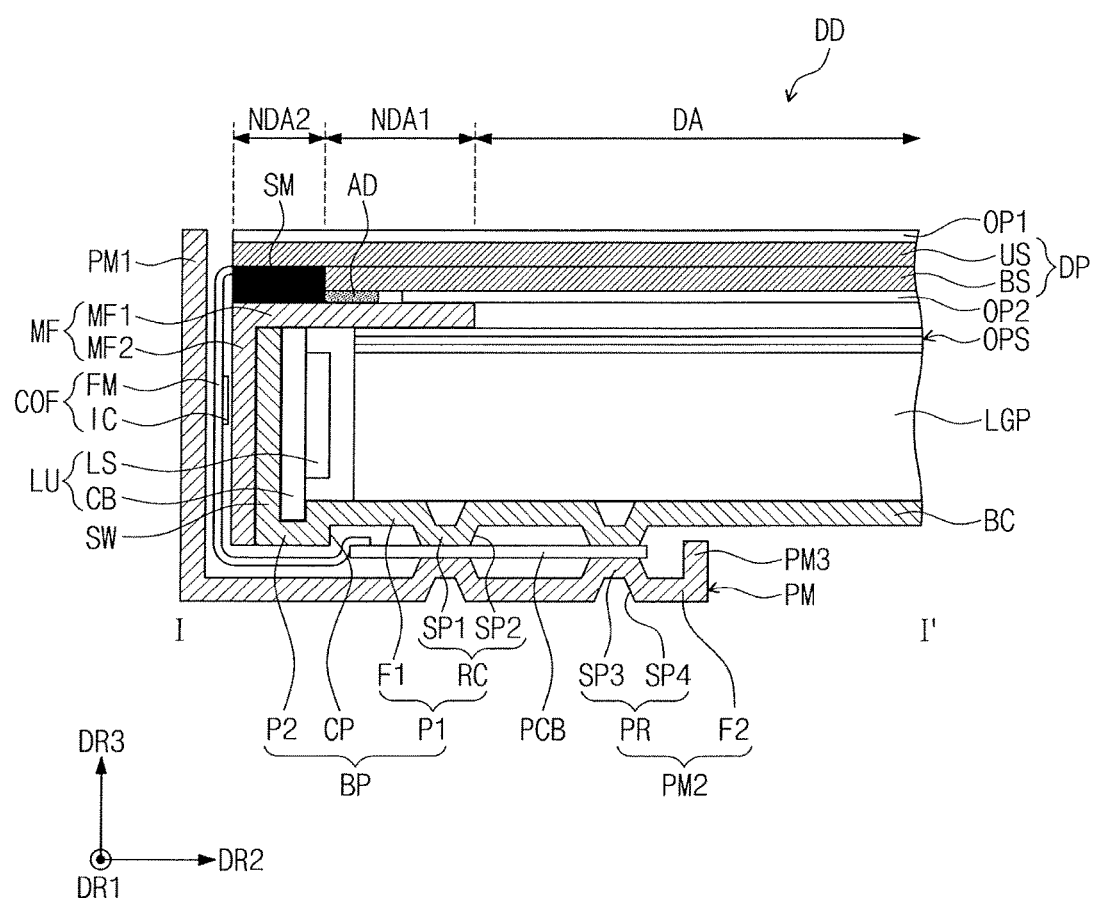
FIG. 4 is a cross-sectional view of the display apparatus taken along line I-I' of FIG. 1.

FIG. 1 is an exploded perspective view of a display apparatus according to an exemplary embodiment of the present invention. FIG. 2 is a perspective view of a display module according to an exemplary embodiment of the present invention. FIG. 3 is a partial exploded perspective view of a display module according to an exemplary embodiment of the present invention. FIG. 4 is a cross-sectional view of the display apparatus taken along line I-I' of FIG. 1.

Firstly, referring to FIG. 1, a display apparatus DD according to an exemplary embodiment of the present invention may include a display module DM and a backlight unit BLU. A direction in which an image is provided from the display apparatus DD may be referred to herein as an upward direction, and a direction opposite to the upward direction may be referred to as a downward direction.

The display module DM may receive light from the backlight unit BLU and generate an image. The display module DM may include a display panel DP and a driving circuit part connected to the display panel DP.

The display panel DP may provide an image through a display surface defined by a first direction DR1 and a second direction DR2 crossing the first direction DR1. The upward direction in which the image is provided may be a third direction DR3 perpendicular to the first direction DR1 and the second direction DR2.

The display panel DP may be a light receiving type display panel; however, exemplary embodiments of the present invention are not limited thereto. The display panel DP may include a liquid crystal display panel, an electrowetting display panel, an electrophoretic display panel, and a microelectromechanical system display panel.

The display panel DP itself may generate light to display an image; however, exemplary embodiments of the present invention are not limited thereto. Thus, at least a portion of the backlight unit BLU may be omitted.

The display panel DP may have a rectangular plate shape having two pairs of sides substantially parallel to each other. In an exemplary embodiment of the present invention, the display panel DP may have a rectangular shape including a pair of relatively longer sides extending in the first direction DR1 and a pair of relatively shorter sides extending in the second direction DR2.

The display panel according to an exemplary embodiment of the present invention may be a flat display panel; however, exemplary embodiments of the present invention are not limited thereto. For example, the display panel DP may have a shape curved in at least one direction.

The display panel DP may include a display area DA displaying an image and a non-display area NDA around the display area DA. The non-display area NDA may include a first non-display area NDA1 surrounding the display area DA and a second non-display area NDA2 surrounding the first non-display area NDA1. The second non-display area NDA2 may surround the display area DA with the first non-display area NDA1 therebetween.

Referring to FIGS. 1 to 3, the display panel DP may include an upper substrate US, a lower substrate BS, a liquid crystal layer disposed between the upper substrate US and the lower substrate BS, and a light shielding member SM.

The upper substrate US may have a top surface exposed to the outside of the display apparatus DD. The top surface of the upper substrate US may be visible to a user of the display apparatus DD. The upper substrate US may overlap the display area DA, the first non-display area NDA1, and the second non-display area NDA2.

The upper substrate US may include first and second side surfaces S1 and S2 corresponding to first and second relatively longer sides, respectively, of the display panel DP. The upper substrate US may include third and fourth side surfaces S3 and S4 corresponding to first and second relatively shorter sides, respectively, of the display panel DP.

The upper substrate US may include one or more pixels overlapping the display area DA. Each of the pixels may include at least one thin-film transistor and a pixel electrode connected to the thin-film transistor.

The upper substrate US may include signal lines connected to each of the pixels. The signal lines may include gate lines GL and data lines DL.

The gate lines GL may extend in the first direction DR1 and may be arranged in the second direction DR2. The gate lines GL may transfer a gate voltage to a corresponding pixel among the pixels.

The data lines DL may extend in the second direction DR2 and may be arranged in the first direction DR1. The data lines DL may be insulated from the gate lines GL. The data lines DL may transfer a data voltage to a corresponding pixel among the pixels.

Each of the signal lines may include a wiring part overlapping the display area DA and the first non-display area NDA1 and a pad part positioned in the second non-display area NDA2. The pad part may be positioned on an end of the wiring part.

According to an exemplary embodiment of the present invention, the pad part may be disposed on a first edge of a bottom surface of the upper substrate US, which corresponds to the first side surface S1 of the upper substrate US; however, exemplary embodiments of the present invention are not limited thereto. For example, the pad part may be disposed on at least one of second to fourth edges of the bottom surface of the upper substrate US, which are each in positions respectively corresponding to the second to fourth side surfaces S2, S3, and S4 of the upper substrate US.

The lower substrate BS may be positioned below the upper substrate US. The lower substrate BS may overlap the display area DA and the first non-display area NDA1. When viewed in a plan view, the lower substrate BS may have an area less than that of the upper substrate US. The lower substrate BS may expose a portion of the upper substrate US, which overlaps the second non-display area NDA2.

The light shielding member SM may be positioned below the upper substrate US and may overlap the second non-display area NDA2. The light shielding member SM may substantially cover the exposed portion of the upper substrate US.

Inner surfaces of light shielding member SM may face side surfaces of the lower substrate BS. The light shielding member SM may substantially surround the side surfaces of the lower substrate BS. As an example, the inner surfaces of the light shielding member SM may be in direct contact the side surfaces of the lower substrate BS.

The light shielding member SM may have an integrated rectangular closed ring shape extending along the first to fourth edges of the bottom surface of the upper substrate US. However, exemplary embodiments of the present invention are not limited to a particular shape of the light shielding member SM. For example, a plurality of light shielding members SM, which may be separable from each other, may be respectively positioned on the first to fourth edges of the bottom surface of the upper substrate US. According to an exemplary embodiment of the present invention, each of the separable light shielding members of the plurality of light shielding members SM may be in direct contact with a respective one of the side surfaces of the lower substrate BS.

The light shielding member SM may have a relatively high light absorption rate. Thus, the light shielding member SM may absorb light leaked from the side surfaces of the lower substrate BS. For example, the light shielding member SM may have a black color.

Alternatively, the light shielding member SM may have a relatively high light reflection rate. Thus, the light shielding member SM may reduce or prevent an occurrence of a phenomenon in which the light leaked from the side surfaces of the lower substrate BS is leaked to the outside of the display apparatus DD. However, exemplary embodiments of the present invention are not limited thereto, and the light shielding member SM may have various colors according to the structure of the display apparatus DD.

The light shielding member SM may be one of a rubber material, a sponge material, or a resin material. The light shielding member SM may have a thickness greater than that of the lower substrate BS. An adhesive may be disposed between the light shielding member SM and the upper substrate US. Thus, the light shielding member SM may be fixed to the bottom surface of the upper substrate US.

The driving circuit part may include a printed circuit board PCB and a chip-on-film COF. The chip-on-film COF may include a flexible circuit film FM and a driving chip IC. The chip-on-film COF may include a plurality of chip-on-film structures.

The flexible circuit film FM may have one end connected to pad parts of the signal lines. The one end of the flexible circuit film FM may be disposed between the upper substrate US and the light shielding member SM.

The driving chip IC may be mounted on one surface of the flexible circuit film FM. The driving chip IC may be disposed on a bottom surface of the flexible circuit film FM in an exemplary embodiment of the present invention; however, exemplary embodiments of the present invention are not limited thereto. For example, the driving chip IC may be disposed on a top surface of the flexible circuit film FM.

Circuits may be mounted on the one surface of the flexible circuit film FM, and the circuits may electrically connect the pad parts of the signal lines to other components.

Additional components may be mounted on the printed circuit board PCB. The printed circuit board PCB may be connected to an end of the flexible circuit film FM opposite to the one end of the flexible circuit film FM connected to pad parts of the signal lines. The printed circuit board PCB may be electrically connected to the pad parts of the signal lines. A driving signal outputted from the printed circuit board PCB may be transmitted to the signal lines through the flexible circuit film FM.

The driving chip IC may provide the driving signal to the signal lines. Although the driving chip IC may provide the driving signal to the data line DL (see, e.g., FIG. 3), the display module DM may further include a separate driving chip providing a driving signal to the gate line GL. The separate driving chip may be mounted on the display panel DP.

The driving chip IC may be connected to the pad parts of the signal lines. Although the driving chip IC may be mounted on the bottom surface of the flexible circuit film FM in an exemplary embodiment of the present invention, exemplary embodiments of the present invention are not limited thereto. For example, the driving chip IC may be disposed on the upper substrate US and may be directly connected to the pad parts of the signal lines.

One portion of the light shielding member SM, which is disposed on the first edge below the upper substrate US, may face the upper substrate US with the flexible circuit film FM therebetween (see, e.g., FIG. 3).

Referring to FIG. 4, the display module DM may include optical films OP1 and OP2, each positioned on at least one surface of the display panel DP. The optical film OP1 and OP2 may include a first optical film OP1 disposed on an upper surface of the upper substrate US and a second optical film OP2 disposed on a lower surface of the lower substrate BS.

The first optical film OP1 may overlap the display area DA, the first non-display area NDA1, and the second non-display area NDA2. In an exemplary embodiment of the present invention, the first optical film OP1 exposed in the third direction DR3 may overlap the light shielding member SM on a plane.

The second optical film OP2 may overlap the display area DA and a portion of the first non-display area NDA1.

In an exemplary embodiment of the present invention, the first optical film OP1 and the second optical film OP2 may each be, e.g., polarizing films having polarizing axes different from each other.

Referring to FIGS. 1 and 4, the backlight unit BLU may be positioned below the display module DM. The backlight unit BLU may provide light to the display panel DP.

The backlight unit BLU may include a bottom chassis BC, a light guide plate LGP, an optical unit LU, an optical sheet OPS, a mold frame MF, and a protective member PM.

The bottom chassis BC may be positioned below the display panel DP. The bottom chassis BC may accommodate the light guide plate LGP, the optical unit LU, and the optical sheet OPS.

The bottom chassis BC may include a bottom part BP and a side wall part SW. The sidewall part SW may extend from the bottom part BP in the third direction DR3 to define a predetermined inner space with the bottom part BP.

When viewed in a plan view, the bottom part BP may have a substantially rectangular shape corresponding to a shape of the display panel DP. The bottom part BP may include a first portion P1, a second portion P2, and a connecting portion CP connecting the first portion P1 to the second portion P2.

The first portion P1 may include a first planar portion F1 and at least one recessed portion RC connected to the first planar portion F1.

The first planar portion F1 may be substantially parallel to the display panel DP. The first planar portion F1 may be spaced a first distance from the lower substrate BS in a direction opposite to the third direction DR3.

The recessed portion RC may include a first sub-portion SP1 and a second sub-portion SP2.

The first sub-portion SP1 may be spaced a second distance, which is greater than the first distance, from the lower substrate BS in the direction opposite to the third direction DR3. The first sub-portion SP1 may be substantially parallel to the first planar portion F1.

The second sub-portion SP2 may connect the first sub-portion SP1 to the first planar portion F1. The second sub-portion SP2 may be inclined at a predetermined angle with respect to the first planar portion F1.

The second portion P2 may be substantially parallel to a plane defined by the first direction DR1 and the second direction DR2. The second portion P2 may be spaced a third distance, which is greater than the first distance, from the lower substrate BS in the direction opposite to the third direction DR3.

The connecting portion CP may connect the first planar portion F1 to the second portion P2. The connecting portion CP may face the sidewall part SW.

In an exemplary embodiment of the present invention, the connecting portion CP, the second portion P2, and the sidewall part SW may be connected to each other to define a predetermined space. At least a portion of the optical unit LU (e.g., a circuit board CB) may be positioned in the space. The connecting portion CP, the second portion P2, and the sidewall part SW may support the optical unit LU.

The light guide plate LGP may guide light incident into the light guide plate LGP to the display panel DP and may be disposed between the display panel DP and the bottom part BP. The light guide plate LGP may include a substantially transparent polymer resin such as polycarbonate or polymethyl methacrylate. The light guide plate LGP may include a light incident surface, a light emitting surface, and a facing surface.

The light guide plate LGP may provide light incident into the light guide plate LGP to the outside of the light guide plate LGP through the light emitting surface. The light emitting surface may be substantially parallel to the display panel DP.

The facing surface may face the light emitting surface. The facing surface may be disposed below the light emitting surface.

The light guide plate LGP may receive light emitted from the optical unit LU through the light incident surface. In an exemplary embodiment of the present invention, the light incident surface may be a side surface of the light guide plate LGP facing the optical unit LU. The side surface of the light guide plate LGP may connect the light emitting surface to the facing surface.

The display apparatus DD may include a reflective member disposed on side surfaces of the light guide plate LGP except for the facing surface and the light incident surface of the light guide plate LGP. The reflective member may reduce or prevent the light incident through the light incident surface of the light guide plate LGP from being leaked to the outside of the light guide plate LGP through the side surfaces of the light guide plate except for the facing surface and the light incident surface of the light guide plate LGP.

The optical unit LU may face the light incident surface of the light guide plate LGP. The optical unit LU may include a light source LS and the circuit board CB.

The light source LS may be positioned on a top surface (e.g., a surface facing the light guide plate LGP) of the circuit board CB. Light emitted from the light source LS may be incident into the light guide plate LGP. As an example, the light source LS may include a point light source, or a line light source; however, exemplary embodiments of the present invention are not limited thereto. In an exemplary embodiment of the present invention, the light source LS may include a light emitting diode (LED) as a point light source. The light source LS may include one LED or a plurality of LED groups as the light source LS.

A wiring providing a power to the light source LS and controlling the power may be printed on the circuit board CB. The circuit board CB may include a light source control unit connected to the light source LS. The light source control unit may be mounted on a separate circuit board from the circuit board CB; however, exemplary embodiments of the present invention are not limited thereto.

The optical unit LU may be fixed in position by the bottom chassis BC. The circuit board CB may be disposed on the second portion P2 of the bottom chassis BC. The circuit board CB may be substantially parallel to the sidewall part SW and may be fixed between the sidewall part SW and the connecting portion CP. The circuit board CB may have a thickness in the second direction DR2, which is substantially the same as a distance between the sidewall part SW and the connecting portion CP.

The optical sheet OPS may be positioned between the display panel DP and the light guide plate LGP. The optical sheet OPS may control a path of light emitted from the light source LS. The optical sheet OPS may include a diffusion sheet, a prism sheet, and a protective sheet, which may be stacked on the light guide plate LGP.

The diffusion sheet may diffuse light. The prism sheet may collect light diffused by the diffusion sheet in a direction substantially perpendicular to a plane of the display panel DP. The protective sheet may be disposed on the prism sheet. The protective sheet may protect the prism sheet against external shock. The optical sheets OPS according to an exemplary embodiment of the present invention may include one diffusion sheet, one prism sheet, and one protective sheet; however, exemplary embodiments of the present invention are not limited thereto. For example, at least one of the diffusion sheet, the prism sheet, and the protective sheet may be provided in plurality and overlapped with each other in the optical sheet OPS, or one or more of the diffusion sheet, the prism sheet, and the protective sheet may be omitted. Alternatively, the diffusion sheet, the prism sheet, and the protective sheet may be stacked in an alternative order to that described herein (e.g., a reverse order).

The mold frame MF may be positioned between the display panel DP and the bottom chassis BC. The mold frame MF may be positioned below the display panel DP and may support the display panel DP. The mold frame MF may fix positions of the optical sheets OPS and the optical unit LU.

The mold frame MF may have a rectangular closed ring shape extending along the first to fourth edges of the bottom surface of the upper substrate US. The mold frame MF may include a first frame MF1 and a second frame MF2.

The first frame MF1 may overlap the first non-display area NDA1 and the second non-display area NDA2. The first frame MF1 may be positioned above the bottom part BP and the sidewall part SW and may be positioned below the light shielding member SM and the lower substrate BS. The light shielding member SM may be fixed to the first frame MF1. An adhesive may be positioned between the light shielding member SM and the first frame MF1. Thus, the light shielding member SM may be attached to the first frame MF1.

The second frame MF2 may be bent from the first frame MF1 and may extend in the direction opposite to the third direction DR3. The second frame MF2 may face the circuit board CB with the sidewall part SW therebetween.

Referring to FIG. 4, the flexible circuit film FM may be bent to face the light shielding member SM, the second frame MF2, and the bottom part BP. Thus, the printed circuit board PCB may be positioned below the bottom chassis BC and may face the bottom part BP of the bottom chassis BC.

In an exemplary embodiment of the present invention, when viewed in a plan view, the printed circuit board PCB may overlap the first planar portion F1 and the recessed portion RC of the bottom part BP.

The protective member PM may protect the chip-on-film COF and the printed circuit board PCB. The protective member PM may include a first protective part PM1, a second protective part PM2, and a third protective part PM3.

The first protective part PM1 may face the light shielding member SM and the sidewall part SW with the chip-on-film COF therebetween. The first protective part PM1 may face the first side surface S1 of the upper substrate US.

The second protective part PM2 may be bent to extend from the first protective part PM1 and may be positioned below the bottom part BP. The second protective part PM2 may face the bottom part BP with the flexible circuit film FM and the printed circuit board PCB therebetween.

The second protective part PM2 may include a second planar portion F2 and at least one protruding portion PR connected to the second planar portion F2.

The second planar portion F2 may be substantially parallel to the plane defined by the first direction DR1 and the second direction DR2. When viewed in a plan view, the second planar portion F2 may overlap the first planar portion F1. The second planar portion F2 may be spaced a fourth distance from the first sub-portion SP1 in the direction opposite to the third direction DR3.

The protruding portion PR may include a third sub-portion SP3 and a fourth sub-portion SP4.

The third sub-portion SP3 may be spaced a fifth distance, which is less than the fourth distance, from the first sub-portion SP1 in the direction opposite to the third direction DR3. The fifth distance may be substantially the same as a thickness of the printed circuit board PCB. The third sub-portion SP3 may extend along a plane parallel to the second planar portion F2.

The fourth sub-portion SP4 may connect the third sub-portion SP3 to the second planar portion F2. The fourth sub-portion SP4 may be inclined at a predetermined angle with respect to the second planar portion F2. When viewed in a plan view, the protruding portion PR may overlap the recessed portion RC.

The printed circuit board PCB may be positioned between the recessed portion RC of the bottom part BP and the protruding portion PR of the second protective part PM2. The display apparatus DD may include a coupling hole passing through the recessed portion RC, the printed circuit board PCB, and the protruding portion PR, which overlap with each other, when viewed in a plan view; however, exemplary embodiments of the present invention are not limited thereto. For example, the display apparatus DD may include an adhesion member disposed between the recessed portion RC and the printed circuit board PCB and between the printed circuit board PCB and the protruding portion PR. Thus, the protective member PM may be fixed to the bottom chassis BC and may protect the chip-on-film COF and the printed circuit board PCB.

The third protective part PM3 may be bent from the second protective part PM2 and may be positioned below the bottom part BP. The third protective part PM3 may face the first protective part PM1. The third protective part PM3 may be omitted, as desired.

The display apparatus DD according to an exemplary embodiment of the present invention may include an adhesion member AD which may fix the display panel DP to the mold frame MF. The adhesion member AD may be positioned between the lower substrate BS and the first frame MF1. The adhesion member AD may overlap a portion of the first non-display area NDA1. The adhesion member AD may include a double-sided tape and an adhesion resin.

Figure 5:
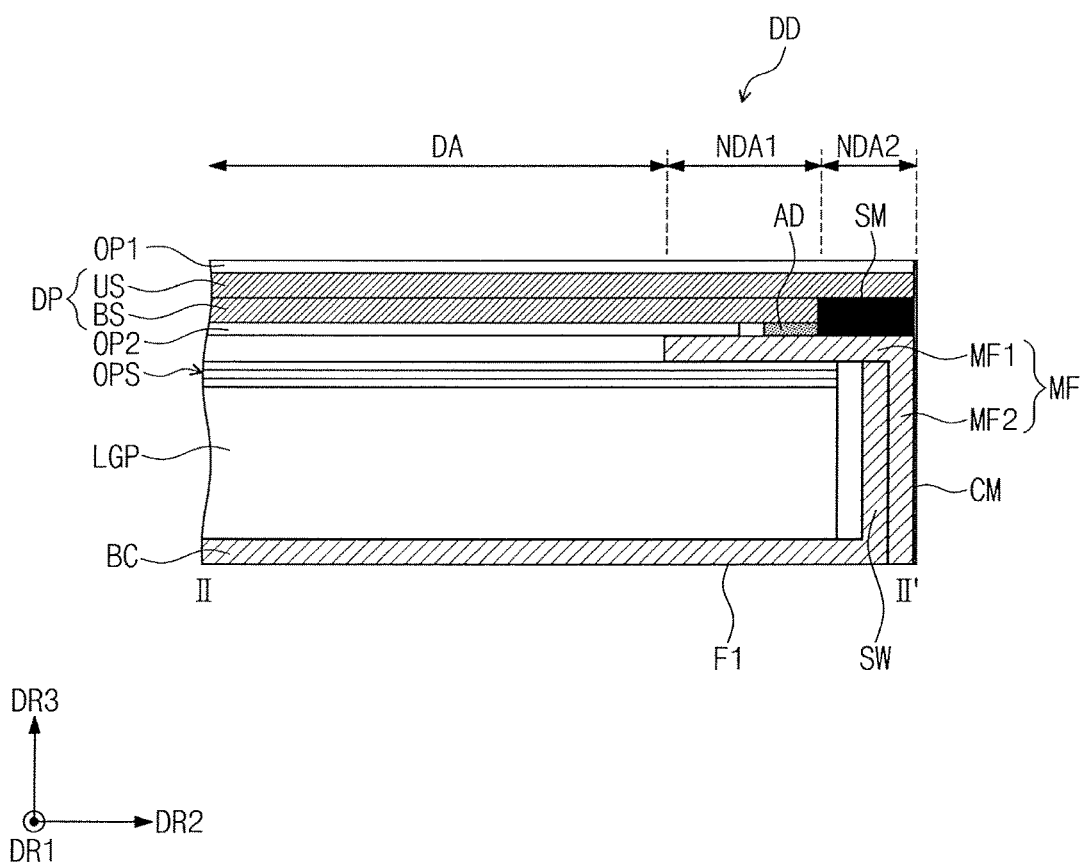
FIG. 5 is a cross-sectional view of the display apparatus taken along line II-II' of FIG. 1.

FIG. 5 is a cross-sectional view of the display apparatus taken along a line II-II' of FIG. 1.

Referring to FIGS. 1 and 5, the display apparatus DD according to an exemplary embodiment of the present invention may include a coupling member CM coupling the upper substrate US, the light shielding member SM, and the second frame MF2 of the mold frame MF to each other.

The coupling member CM may substantially cover the second side surface S2 of the upper substrate US, a side surface of the light shielding member SM disposed on substantially the same plane as the second side surface S2, and a side surface of the second frame MF2 disposed on substantially the same plane as the second side surface S2 and the side surface of the light shielding member SM. The coupling member CM may include, e.g., a tape.

The coupling member CM according to an exemplary embodiment of the present invention may be disposed on the second side surface S2 of the upper substrate US; however, exemplary embodiments of the present invention are not limited thereto. For example, the coupling member CM may be disposed on at least one side surface of the second to fourth side surfaces S2, S3, and S4. Here, the coupling member CM may substantially cover one side surface of the second to fourth side surfaces S2, S3, and S4, one side surface of the light shielding member SM disposed on substantially the same plane as the one side surface of the second to fourth side surfaces S2, S3, and S4, and one side surface of the second frame MF2 disposed on substantially the same plane as the one side surface of the second to fourth side surfaces S2, S3, and S4 and the one side surface of the light shielding member SM.

The display apparatus DD according to an exemplary embodiment of the present invention may include the light shielding member SM positioned below the upper substrate US and substantially surrounding the lower substrate BS, and thus a phenomenon in which light provided from the backlight unit BLU is leaked to the side surface of the lower substrate BS may be reduce or prevented. Thus, an additional member for protecting the display module DM, e.g., a top chassis, may be omitted, and a relatively slim display apparatus DD may be formed.

A display apparatus according to an exemplary embodiment of the present invention will be described in more detail below with reference to FIG. 6. Components described below with reference to FIG. 6 having the same reference numerals as those described above with reference to FIGS. 1 to 5 may be substantially the same as the components described above with reference to FIGS. 1 to 5 and thus duplicative descriptions may be omitted.

Figure 6:
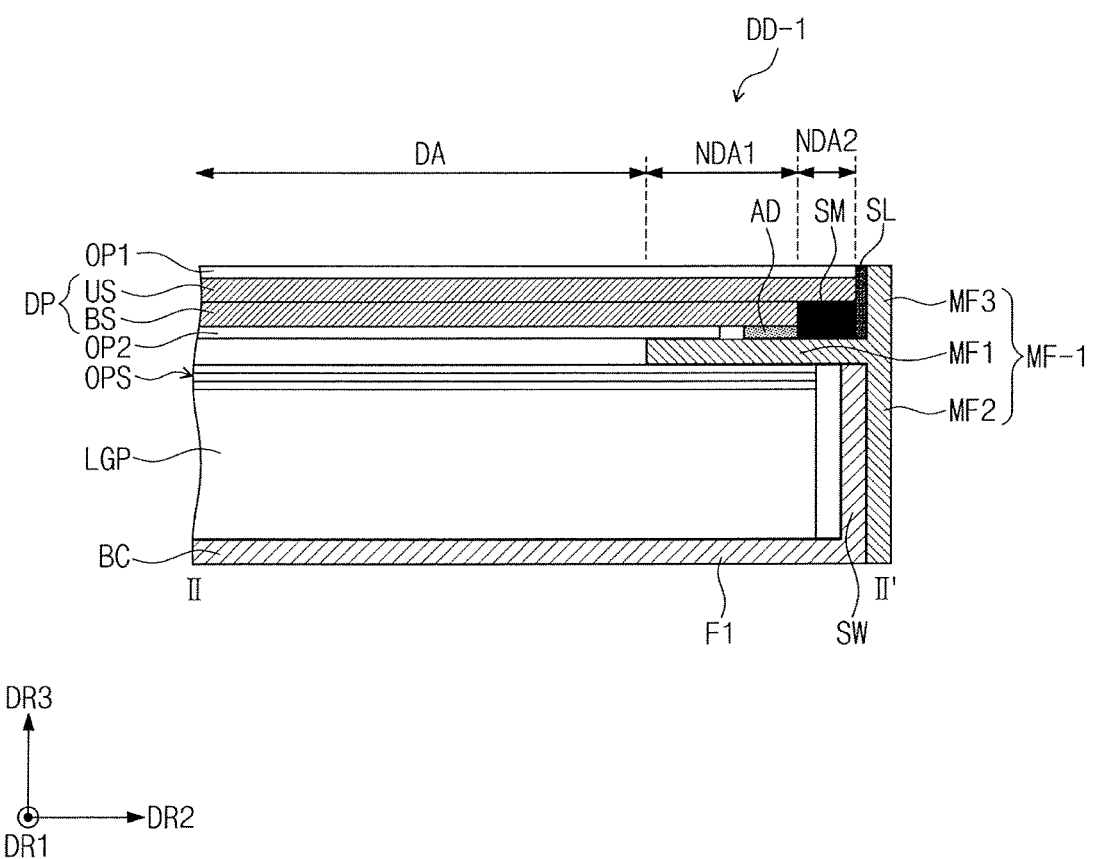
FIG. 6 is a partial cross-sectional view of a display apparatus according to an exemplary embodiment of the present invention.

FIG. 6 is a partial cross-sectional view of a display apparatus according to an exemplary embodiment of the present invention. FIG. 6 illustrates another embodiment of the mold frame MF.

Referring to FIG. 6, a display apparatus DD-1 according to an exemplary embodiment of the present invention may include a mold frame MF-1 including a first frame MF1, a second frame MF2, and a third frame MF3.

The third frame MF3 may extend from the second frame MF2 and may protect the upper substrate US and the light shielding member SM.

The third frame MF3 may face the second side surface S2 of the upper substrate US (see, e.g., FIG. 1) and a side surface of the light shielding member SM. The side surface of the light shielding member SM may be substantially aligned with the second side surface S2 of the upper substrate US along the third direction DR3.

An uppermost edge of the third frame MF3 may be positioned above the second side surface S2 of the upper substrate US along the third direction DR. The uppermost edge of the third frame MF3 may be additionally positioned above the second to fourth side surfaces S2, S3, and S4 of the upper substrate US (see, e.g., FIG. 1) along the third direction DR3. A side surface of the third frame MF3 may face at least one side surface of the first to fourth side surfaces S1, S2, S3, and S4 and one side surface of the light shielding member SM. The one side surface of the light shielding member SM may be substantially aligned with the at least one side surface of the first to fourth side surfaces S1, S2, S3, and S4 of the upper substrate US along the third direction DR3.

The display apparatus DD-1 according to an exemplary embodiment of the present invention may include a sealing member SL disposed between the third frame MF3 and the at least one side surface of the first to fourth side surfaces S1, S2, S3, and S4 of the upper substrate US and between the third frame MF3 and one side surface of the light shielding member SM. The sealing member SL may couple the upper substrate US to the light shielding member SM. The sealing member SL may prevent foreign substances from being introduced from the outside into the display panel DP.

The signal lines according to an exemplary embodiment of the present invention may be positioned on the upper substrate US; however, exemplary embodiments of the present invention are not limited thereto.

A display module DM-1 according to an exemplary embodiment of the present invention will be described in more detail below with reference to FIG. 7. Components described below with reference to FIG. 7 having the same reference numerals as those described above with reference to FIGS. 1 to 5 may be substantially the same as the components described above with reference to FIGS. 1 to 5 and thus duplicative descriptions may be omitted.

Figure 7:
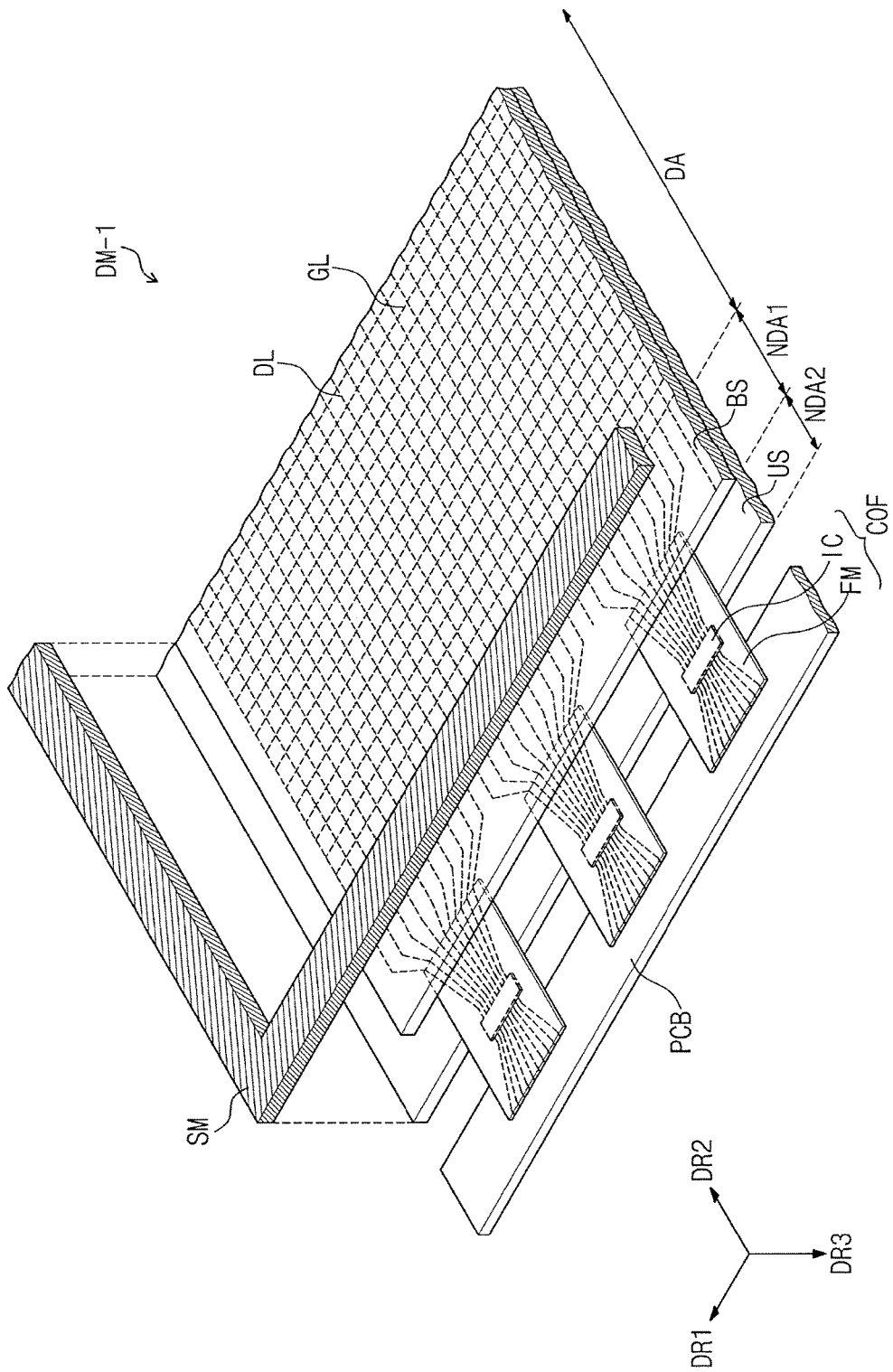
FIG. 7 is a partial exploded perspective view of a display module according to an exemplary embodiment of the present invention.

FIG. 7 is a partial exploded perspective view of a display module according to an exemplary embodiment of the present invention.

Referring to FIG. 7, the display module DM-1 according to an exemplary embodiment of the present invention may include the lower substrate BS, the upper substrate US, and the light shielding member SM.

The lower substrate BS may include one or more pixels overlapping the display area DA. Each of the pixels may include at least one thin-film transistor and a pixel electrode connected to the thin-film transistor.

The lower substrate BS may include signal lines respectively connected to each of the pixels. The signal lines may include gate lines GL and data lines DL.

Each of the signal lines may include a wiring part overlapping the display area DA and a portion of the first non-display area NDA1 and a pad part disposed on a portion of the first non-display area NDA1 not overlapped by the wiring part. The pad part may be positioned on an end of the wiring part.

The upper substrate US may be disposed on the lower substrate BS and may substantially cover the lower substrate BS.

The flexible circuit film FM may have an end connected to the pad parts of the signal lines. A first portion of the flexible circuit film FM, which partially overlaps the first non-display area NDA1, may be disposed between the upper substrate US and the lower substrate BS. A second portion of the flexible circuit film FM, which overlaps the second non-display area NDA2, may be disposed between the upper substrate and the light shielding member SM.

The light shielding member SM may be attached to a bottom surface of the upper substrate US with the flexible circuit film FM disposed between a portion of the light shielding member SM and the bottom surface of the upper substrate US. Thus, the light shielding member SM may reduce or prevent an occurrence of a phenomenon in which light leaked from side surfaces of the lower substrate BS is leaked to the outside of the display module DM-1.

The display panel according to an exemplary embodiment of the present invention and the display apparatus including the same may reduce or prevent a leakage of light from through the side surface of the display panel. Thus, the display quality of the display panel may be increased. Additionally, a relatively thin display apparatus may be formed.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display apparatus comprising:
a display panel including a display area, a first non-display area surrounding the display area, and a second non-display area surrounding the first non-display area; and
a backlight unit positioned below the display panel;
a flexible circuit film connected to the signal lines;
a driving chip mounted on the flexible circuit film; and
a printed circuit board connected to the flexible circuit film,
wherein the display panel comprises:
an upper substrate overlapping the display area, the first non-display area, and the second non-display area and comprising signal lines overlapping the display area, first non-display area, and the second non-display area;
a lower substrate positioned above the backlight unit and below the upper substrate and overlapping the display area and the first non-display area; and
a light shielding member positioned below the upper substrate and overlapping the second non-display area, wherein an inner surface of the light shielding member faces a side surface of the lower substrate, and wherein the light shielding member is in direct contact with a bottom surface of the upper substrate facing the lower substrate.

2. The display apparatus of claim 1, wherein the upper substrate has a surface area greater than that of the lower substrate when viewed in a plan view.

3. The display apparatus of claim 2, wherein the lower substrate exposes a portion of the upper substrate in the second non-display area.

4. The display apparatus of claim 3, wherein the light shielding member comprises one of a rubber material, a sponge material, or a resin material.

5. The display apparatus of claim 3, wherein the light shielding member has a thickness greater than that of the lower substrate.

6. The display apparatus of claim 1, wherein the light shielding member substantially covers the side surface of the lower substrate.

7. A display apparatus, comprising:
a display panel including a display area, a first non-display area surrounding the display area, and a second non-display area surrounding the first non-display area; and
a backlight unit positioned below the display panel,
wherein the display panel comprises:
an upper substrate overlapping the display area, the first non-display area, and the second non-display area;
a lower substrate positioned below the upper substrate and overlapping the display area and the first non-display area; and
a light shielding member positioned below the upper substrate and overlapping the second non-display area, wherein an inner surface of the light shielding member faces a side surface of the lower substrate,
wherein the upper substrate comprises signal lines overlapping the display area, the first non-display area, and the second non-display area, and
the display apparatus further comprises:
a flexible circuit film connected to the signal lines;
a driving chip mounted on the flexible circuit film; and
a printed circuit board connected to the flexible circuit film,
wherein the flexible circuit film is disposed between a portion of the light shielding member and a portion of the upper substrate,
wherein the backlight unit comprises:
a bottom chassis comprising a bottom part disposed below the lower substrate and a sidewall part bent to extend from the bottom part;
a mold frame comprising a first frame disposed on the bottom part and the sidewall part and below the light shielding member and the lower substrate and a second frame bent to extend from the first frame and to face the sidewall part;
a light guide plate disposed between the bottom chassis and the mold frame; and
an optical unit positioned in the bottom chassis, wherein the optical unit is configured to provide light to the light guide plate,
wherein the flexible circuit film is bent to face the light shielding member, the second frame, and the bottom part,
wherein the bottom part of the bottom chassis comprises:
a first portion comprising a first planar portion spaced a first distance from the lower substrate in a direction orthogonal to a bottom surface of the lower substrate and at least one recessed portion connected to the first planar portion;
a second portion spaced a second distance, which is greater than the first distance, from the lower substrate in the direction orthogonal to the bottom surface of the lower substrate to support the light source unit; and
a connecting portion which connects the first planar portion to the second planar portion and faces the sidewall part,
wherein the backlight unit further comprises:
a first protective part facing the second frame, wherein the flexible circuit film is positioned between the first protective part and the second frame;
a second protective part bent to extend from the first protective part and disposed below the bottom part; and
a third protective part bent to extend from the second protective part to face the first protective part.

8. The display apparatus of claim 7, wherein the printed circuit board is disposed between the bottom chassis and the second protective part.

9. The display apparatus of claim 8, wherein the upper substrate comprises first and second side surfaces extending in a first direction and spaced apart from each other in a second direction crossing the first direction and third and fourth side surfaces extending in the second direction and spaced apart from each other in the first direction, and wherein
the first side surface is substantially covered by the first protective part.

10. The display apparatus of claim 9, further comprising a coupling member configured to couple the upper substrate, the light shielding member, and the second frame with each other,
wherein the coupling member substantially covers at least one of the second, third and fourth side surfaces of the upper substrate, one side surface of the light shielding member, and one side surface of the second frame, wherein the at least one of the second, third and fourth side surfaces of the upper substrate, the one side surface of the light shielding member, and the one side surface of the second frame are substantially aligned with each other along a direction perpendicular to a top surface of the upper substrate.

11. The display apparatus of claim 10, wherein the mold frame further comprises a third frame extending from the second frame and facing one side surface of the second side surface, the third side surface, and the fourth side surface and one side surface of the light shielding member.

12. The display apparatus of claim 11, further comprising a sealing member disposed between the one side surface of the second side surface, the third side surface, and the fourth side surface and the third frame and between the third frame and the one side surface of the light shielding member.

13. The display apparatus of claim 1, wherein the flexible circuit film is disposed between a portion of the light shielding member and a portion of the upper substrate.

14. The display apparatus of claim 13, wherein the backlight unit comprises:
a bottom chassis comprising a bottom part disposed below the lower substrate and a sidewall part bent to extend from the bottom part;
a mold frame comprising a first frame disposed on the bottom part and the sidewall part and below the light shielding member and the lower substrate and a second frame bent to extend from the first frame and to face the sidewall part;
a light guide plate disposed between the bottom chassis and the mold frame; and
an optical unit positioned in the bottom chassis, wherein the optical unit is configured to provide light to the light guide plate, and wherein
the flexible circuit film is bent to face the light shielding member, the second frame, and the bottom part.

15. The display apparatus of claim 14, wherein the light shielding member is fixed to the first frame.

16. The display apparatus of claim 14, wherein the bottom part of the bottom chassis comprises:
a first portion comprising a first planar portion spaced a first distance from the lower substrate in a direction orthogonal to a bottom surface of the lower substrate and at least one recessed portion connected to the first planar portion;
a second portion spaced a second distance, which is greater than the first distance, from the lower substrate in the direction orthogonal to the bottom surface of the lower substrate to support the light source unit; and
a connecting portion which connects the first planar portion to the second planar portion and faces the sidewall part.

17. The display apparatus of claim 7, wherein the flexible circuit film is disposed between the upper substrate and the lower substrate and between the upper substrate and the light shielding member.

18. A display panel comprising:
an upper substrate comprising a display area, a first non-display area substantially surrounding the display area, a second non-display area substantially surrounding the display area with the first non-display area therebetween, wherein an image is provided through a top surface of the upper substrate and comprising signal lines overlapping the display area, the first non-display area, and the second non-display area;
a lower substrate disposed below the upper substrate and overlapping the display area and the first non-display area; and
a light shielding member disposed below the upper substrate and overlapping the second non-display area and facing a side surface of the lower substrate,
wherein the light shielding member is in direct contact with a bottom surface of the upper substrate, wherein a side surface of the light shielding member facing away from the side surface of the lower substrate is substantially coplanar with a side surface of the upper substrate,
wherein, when viewed in a plan view, the upper substrate has a surface area greater than that of the lower substrate, and wherein the lower substrate exposes the second non-display area of the upper substrate.

19. The display panel of claim 18, wherein the light shielding member substantially surrounds side surfaces of the lower substrate.

20. The display panel of claim 18, wherein inner surfaces of the light shield member are each in direct contact with a respective side surface of the lower substrate.

21. The display panel of claim 19, wherein the light shielding member has a greater thickness than a thickness of the lower substrate.

* * * * *